(12) United States Patent
Jeong

(10) Patent No.: US 11,456,159 B2
(45) Date of Patent: Sep. 27, 2022

(54) PLASMA PROCESSING SYSTEM

(71) Applicant: XIA TAI XIN SEMICONDUCTOR (QING DAO) LTD., Qingdao (CN)

(72) Inventor: Woohyun Jeong, Singapore (SG)

(73) Assignee: XIA TAI XIN SEMICONDUCTOR (QING DAO) LTD., Qingdao (CN)

( * ) Notice: Subject to any disclaimer, the term of this patent is extended or adjusted under 35 U.S.C. 154(b) by 0 days.

(21) Appl. No.: 16/663,384

(22) Filed: Oct. 25, 2019

(65) Prior Publication Data

US 2021/0125813 A1  Apr. 29, 2021

(51) Int. Cl.
H01J 37/32 (2006.01)
H01L 21/67 (2006.01)
H01L 21/683 (2006.01)

(52) U.S. Cl.
CPC .. *H01J 37/32715* (2013.01); *H01J 37/32642* (2013.01); *H01L 21/67069* (2013.01); *H01L 21/6833* (2013.01); *H01J 2237/2007* (2013.01); *H01J 2237/334* (2013.01)

(58) Field of Classification Search
CPC .......... H01J 37/32715; H01J 37/32642; H01J 2237/2007; H01J 2237/334; H01L 21/6833; H01L 21/67069
See application file for complete search history.

(56) References Cited

U.S. PATENT DOCUMENTS

| | | | |
|---|---|---|---|
| 2005/0103275 A1* | 5/2005 | Sasaki | H01J 37/32706 118/728 |
| 2007/0086143 A1* | 4/2007 | Hayashi | H01J 37/321 361/230 |
| 2010/0243620 A1* | 9/2010 | Yamawaku | H01J 37/32623 219/121.54 |
| 2016/0351404 A1* | 12/2016 | Aramaki | H01J 37/32577 |
| 2018/0350566 A1* | 12/2018 | Tobe | H01J 37/32642 |

\* cited by examiner

*Primary Examiner* — Yuechuan Yu
(74) *Attorney, Agent, or Firm* — ScienBiziP, P.C.

(57) ABSTRACT

A plasma processing system is provided. The plasma processing system includes an edge ring assembly that includes a dielectric ring and a coil. The coil is embedded within the dielectric ring. The coil generates a magnetic field that affects the ions in the proximity of the plasma sheath and in turn increases the fabrication yield of the semiconductor process.

15 Claims, 7 Drawing Sheets

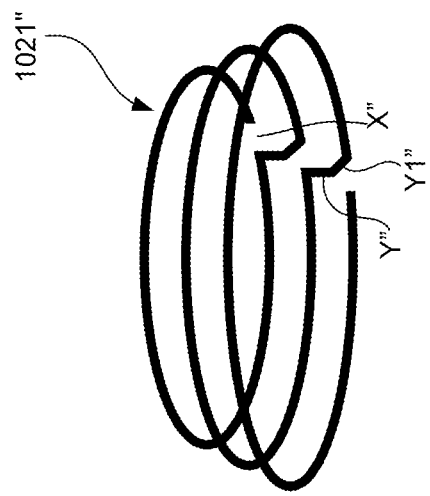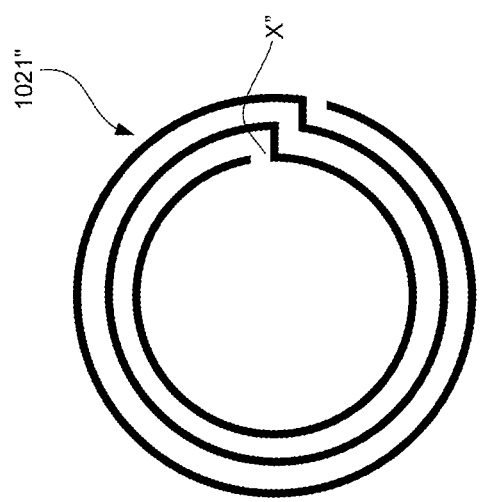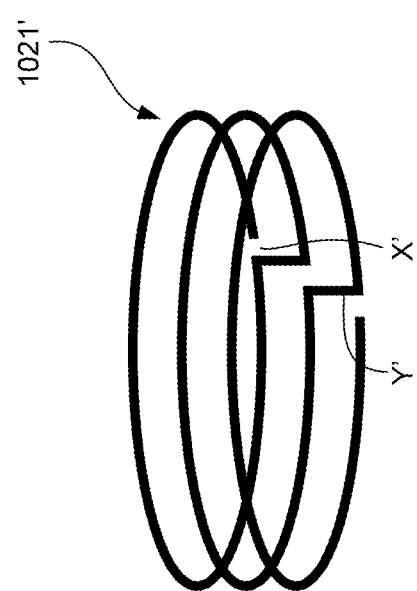

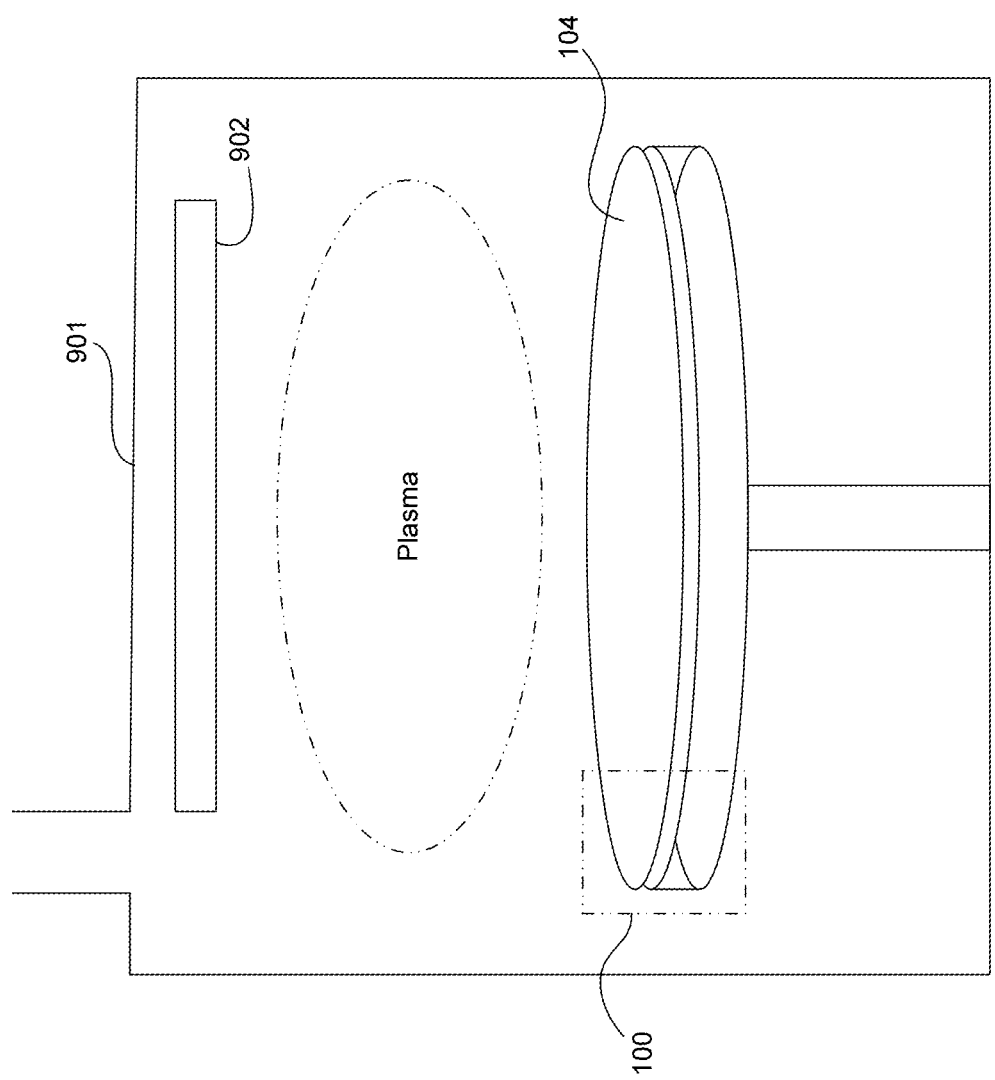

PLASMA PROCESSING SYSTEM

BACKGROUND

1. Field

The present disclosure generally relates to plasma processing system, and more particularly, plasma processing system having an edge ring with a coil embedded therein.

2. Description of the Related Art

Due to limitations in fabrication machines, the no-good dies generally come from dies fabricated in the wafer edge area. As semiconductor technology continuously develop, the number of dies produced in a wafer increases. Ergo, the number of dies produced in the wafer edge region are increased as well. Thus, the importance of accurately performing fabrication process in the wafer edge area becomes significantly more important for the fabrication yield of semiconductor process.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIG. 4 illustrates an isometric view of a coil according to some other embodiments of the instant disclosure;

FIG. 5A illustrates a top view of a coil according to some embodiments of the instant disclosure;

FIG. 5B illustrates an isometric view of a coil according to some embodiments of the instant disclosure;

FIG. 9 illustrate a plasma processing system according to some embodiments of the instant disclosure.

Figure 1:
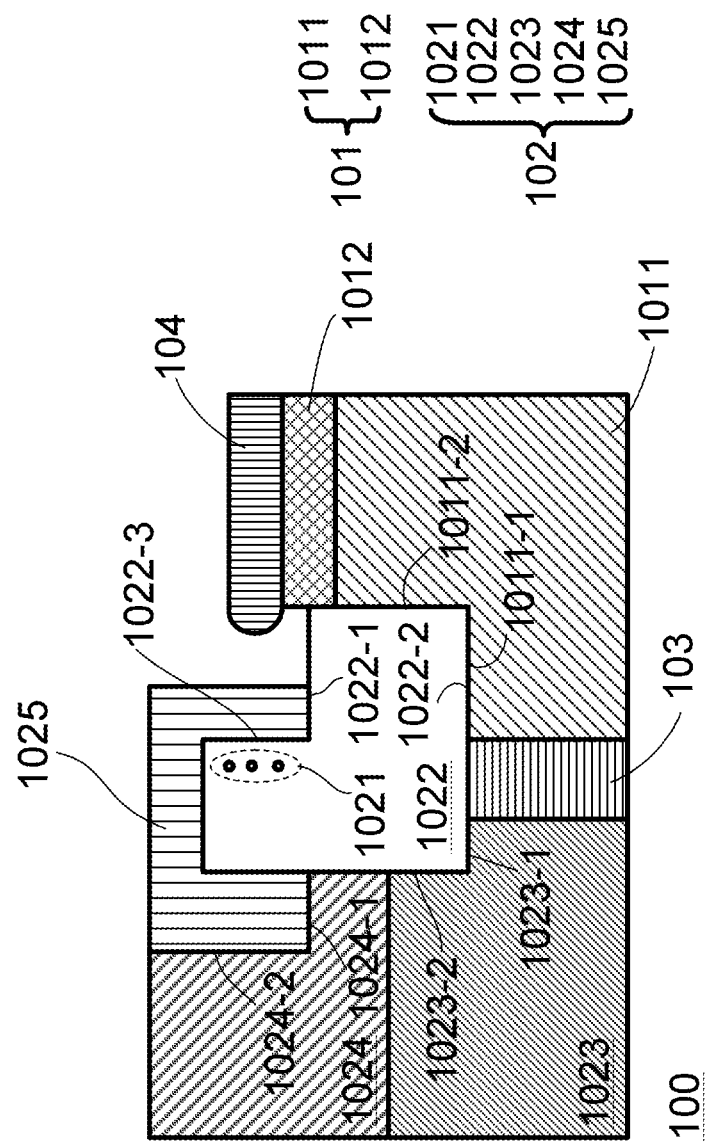
FIG. 1 illustrates a regional cross section view of a plasma processing system according to some embodiments of the instant disclosure.

It is to be noted, however, that the appended drawings illustrate only exemplary embodiments of this disclosure and are therefore not to be considered limiting of its scope, for the disclosure may admit to other equally effective embodiments.

DETAILED DESCRIPTION

The present disclosure will now be described more fully hereinafter with reference to the accompanying drawings, in which exemplary embodiments of the disclosure are shown. This disclosure may, however, be embodied in many different forms and should not be construed as limited to the exemplary embodiments set forth herein. Rather, these exemplary embodiments are provided so that this disclosure will be thorough and complete, and will fully convey the scope of the disclosure to those skilled in the art. Like reference numerals refer to like elements throughout.

The terminology used herein is for the purpose of describing particular exemplary embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," or "includes" and/or "including" or "has" and/or "having" when used herein, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Figure 8:
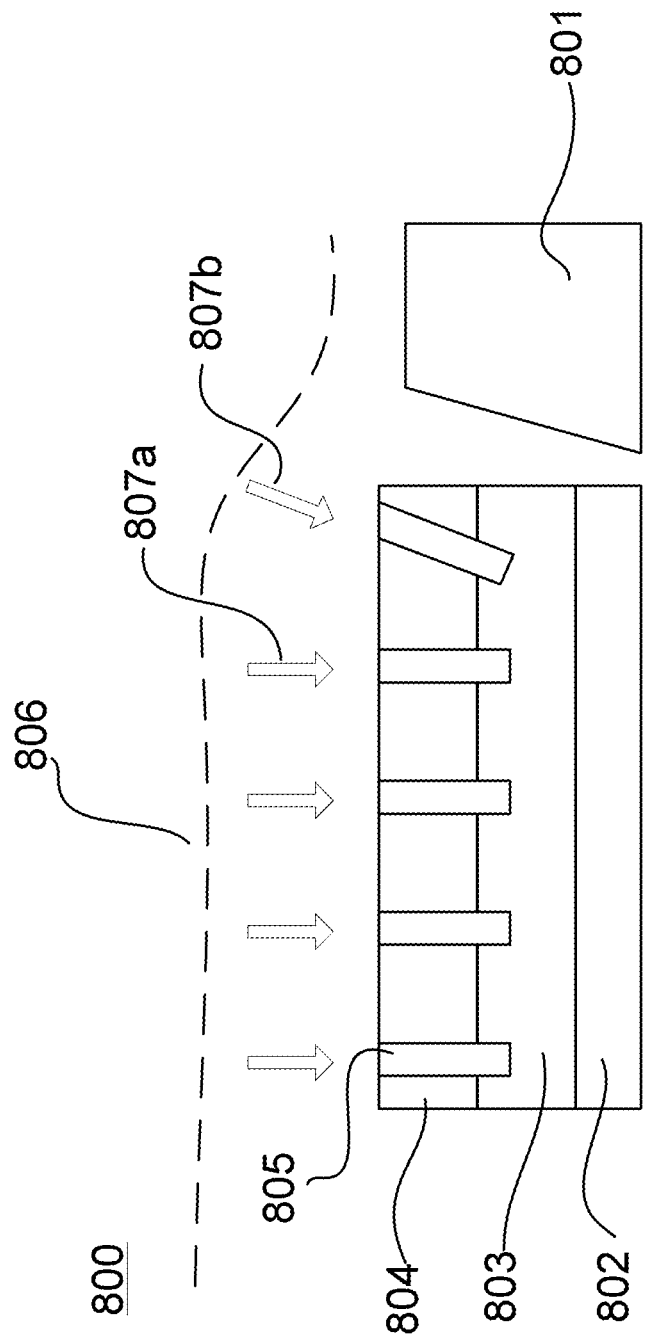
FIG. 8 illustrate a cross section of a plasma processing system according to a related embodiment.

FIG. 8 illustrate a regional cross section view of a plasma processing system 800 according to a related embodiment. The plasma processing system 800 has an edge ring 801 surrounding a wafer 802. The edge ring 801 is typically a unitary member made of a single material. A first film 803 and a second film 804 is disposed on the wafer 802. The sum thickness of the wafer 802, the first film 803, and the second film 804 is large enough so that the second film 804 protrudes above the surface of the edge ring 801. Trenches 805 are formed on the first film 803 and the second film 804. The instant figure schematically illustrates a plasma etching process, in which the second film 804 is bombarded by ions in plasma provided from above the second film 804. Directions of the ions are shown by arrows 807a, 807b in FIG. 8. Ideally, the trenches 805 are formed to be perpendicular to the wafer 802. The direction of the ions is substantially perpendicular to the wafer 802 around an inner/center region thereof as shown by the arrows 807a. However, plasma sheath 806 (as indicated by the dash line) experiences a bending effect at an edge region of the wafer 802. Thus, the direction of ions in the proximity of the bent portion of the plasma sheath 806 becomes tilted as shown by the arrows 807b. As a result, the trenches 805 formed proximate the edge region of the wafer 802 also become tilted compared to the trenches formed in the central area of the wafer 802. The tilting on the edge region of the wafer 802 often causes defect and thus lowers the fabrication yield during semiconductor process. Thus, there is a need to find a way to prevent tilting of ions in the edge region of the wafer 802.

FIG. 9 illustrate a plasma processing system according to some embodiments of the present disclosure. The plasma processing system is formed within a process chamber 901. The process chamber 901 may house an electrode 902 to provide charges for forming the plasma within the process chamber 901 and an electrostatic chuck (ESC) to hold a wafer 104. A closeup of a portion of the plasma processing system is shown in FIG. 1. FIG. 1 illustrates a regional cross section view of a plasma processing system 100 (e.g., at a wafer edge/seal ring region) according to some embodiments of the instant disclosure. The plasma processing system 100 comprises an electrostatic chuck (ESC) 101 and an edge ring assembly 102 configured to surround the ESC 101. The electrostatic chuck (ESC) 101 includes an ESC base 1011 and an ESC dielectric layer 1012 disposed on the ESC base 1011. In some embodiments, the material used for the ESC base 1011 is made of aluminum. In the illustrated example, a wafer 104 is disposed on the ESC dielectric layer 1012. Though there may be other layers disposed on a surface of the wafer 104, the edge ring assembly 102 in accordance with the instant disclosure is configured to have a top surface higher than the wafer 104 despite the inclusion of the additional layers disposed on the surface of the wafer 104. In an exemplary embodiment, the wafer 104 is sunken from the top surface of the edge ring assembly 102 by about 1 mm to 2 mm. In some embodiments, the ESC base 1011 has a step edge at its periphery. The step edge of the ESC base 1011 has a step wall 1011-2 perpendicular to a step base 1011-1. The edge ring assembly 102 may include a dielectric ring 1022 and a coil 1021 disposed within the dielectric ring 1022. In some embodiments, dielectric ring 1022 is disposed over the step base 1011-1 of the ESC base 1011. The dielectric ring 1022 has a step edge on its inner periphery. The step edge of the dielectric ring 1022 has a step wall 1022-3 perpendicular to a step base 1022-1. In some embodiments, the step wall 1022-3 has a height greater than the thickness of the wafer 104 (taking into account all the layers formed on the surface thereof). In some embodiments, the coil 1021 is formed along the step wall 1022-3 of the dielectric ring 1022. In some embodiments, the coil 1021 is coupled to at least one DC voltage source and configured to generate a magnetic field corresponding to the DC voltage source. The magnetic field is used to adjust the direction of the ion. In some embodiments, a voltage terminal is disposed through the ESC 101 and configured to couple the coil 1021 to the DC voltage source. A supplied voltage of the at least one DC voltage source may range from about −24 volts to +24 volts.

In some embodiments, the edge ring assembly 102 further includes a first quartz ring 1023 surrounding the periphery of the ESC 101 and a second quartz ring 1024 disposed over the first quartz ring 1023. The first quartz ring 1023 has a step edge on an inner periphery. The step edge of the first quartz ring 1023 has a step wall 1023-2 perpendicular to a step base 1023-1. The dielectric ring 1022 is further disposed over the step base 1023-1 of the first quartz ring 1023. The second quartz ring 1024 has a step edge on an inner periphery. The step edge of the second quartz ring 1024 has a step wall 1024-2 perpendicular to a step base 1024-1. The second quartz ring 1024 is configured to be a separate structure from the first quartz ring 1023 so that when the second quartz ring 1024 is damaged, there is no need to replace the first quartz ring 1023 along with the second quartz ring 1024. In some embodiments, the edge ring assembly 102 further includes a tuning ring 1025 for covering the protrusion of the dielectric ring 1022. In other words, the tuning ring 1025 is configured to be coupleable over the top surface of the dielectric ring 1022. The inclusion of a tuning ring (e.g., ring 1025) may further alleviate the plasma sheath bending effect. For one thing, the presence of the tuning ring 1025 may enhance the effect of the coil 1021, thereby further tuning the profile of the plasma sheath at the edge region of the processed work-piece (e.g., wafer). In some embodiments, the tilt angle of ions at the wafer edge may be tuned to achieve further uniformity (e.g., with respect to the tilt angle of ions at central region of wafer). In some embodiments, the tilt angle of ions at the edge region of wafer may be tuned to achieve substantially 90 degrees. In some embodiments, the material composition of the tuning ring may substantially include silicon. In some embodiments, the tuning ring may include a material that is identical or similar to that of the processed work-piece.

In some embodiments, the protrusion of the dielectric ring 1022 is arranged to hold the tuning ring 1025 in place. The tuning ring 1025 may be disposed over the step base 1022-1 of the dielectric ring 1022 and the step base 1024-1 of the second quartz ring 1024. The tuning ring 1025 has a top surface and a bottom surface opposite the top surface. A cavity is formed along the bottom surface of the tuning ring 1025. The cavity is configured to cap a portion of the dielectric ring 1022 protruding from the step base 1022-1 of the dielectric ring 1022. In some embodiments where the edge ring assembly 102 is formed to have no tuning ring (e.g., ring 1025), a top surface of the protrusion of the dielectric ring 1022 may be configured to be higher than the wafer 104 (including all the layers disposed on the surface of the wafer 104). In some embodiments where the edge ring assembly 102 is formed to have tuning ring 1025, a top surface of tuning ring 1025 may be higher than the wafer 104 (including the layers disposed on the surface of the wafer 104). In some embodiments, the plasma processing system 100 further comprises a quartz filler 103 disposed between the edge ring assembly 102 and the ESC 101.

Figure 2:
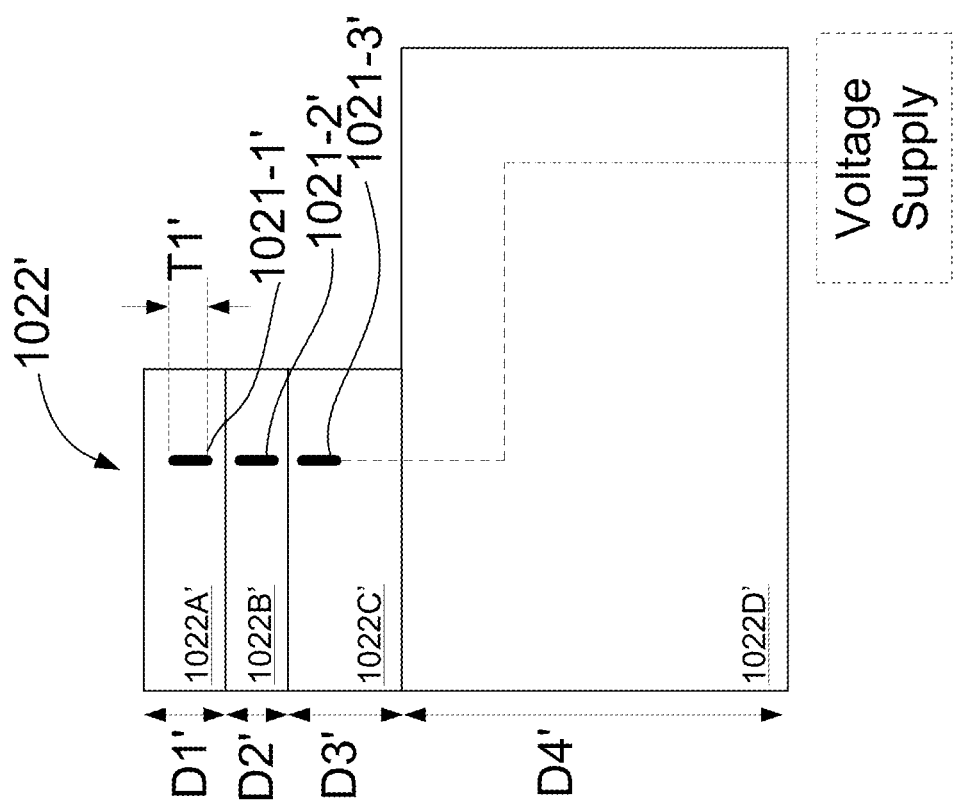
FIG. 2 illustrates a cross section of a dielectric ring according to some embodiments of the instant disclosure.

FIG. 2 illustrates a cross section of a dielectric ring 1022' according to some embodiments of the instant disclosure. The dielectric ring 1022' of the edge ring assembly may be formed by a plurality of dielectric layers, e.g., layers 1022A', 1022B', and 1022C', and a base dielectric layer 1022D' stacked on top of each other. The base dielectric layer 1022D' forms a top facing surface (top surface) of the dielectric ring 1022' and a bottom surface of the dielectric ring 1022' opposite the top facing surface. The plurality of dielectric layers 1022A', 1022B', and 1022C' forms a protrusion of the dielectric ring 1022' upward extending from the top surface of the dielectric ring 1022'. In some embodiments, the plurality of dielectric layers 1022A', 1022B', and 1022C' and the base dielectric layer 1022D' comprise toroid structures. The plurality of dielectric layers 1022A', 1022B', and 1022C' may have the same planar area and be aligned to each other when stacked on top of one another. The base dielectric layer 1022D' has a planar area greater than each one of the plurality of dielectric layers 1022A', 1022B', and 1022C'. In some embodiments, the outer radius of the plurality of dielectric layers 1022A', 1022B', 1022C', and the base dielectric layer 1022D' are substantially the same, while the inner radius of the plurality of dielectric layers 1022A', 1022B', and 1022C' is greater than the inner radius of the base dielectric layer 1022D'. The area left exposed on a surface of the base dielectric layer 1022D' after stacking the plurality of dielectric layers 1022A', 1022B', and 1022C' thereon forms the step base of the dielectric ring 1022'.

In some embodiments, a height of the protrusion is configured to be greater than a thickness of a wafer. In the illustrated embodiment, the height of the protrusion of the dielectric ring 1022' is defined as a sum of the thickness of the plurality of dielectric layers 1022A', 1022B', and 1022C'. The thickness of each of the plurality of dielectric layers 1022A', 1022B', and 1022C' may be the same or different from each other. In an exemplary embodiment, when the thickness of the plurality of dielectric layers 1022A', 1022B', and 1022C' are different from each other, the thickness D1' of the dielectric layer 1022A' is about 160 μm, the thickness D2' of the dielectric layer 1022B' is about 100 μm, and the thickness D3' of the dielectric layer 1022C' is about 640 μm. In an exemplary embodiment, the thickness D4' of the base dielectric layer 1022D' is about 10 mm. In some embodiments, the dielectric ring is made of ceramic material.

In some embodiments, the coil 1021' is embedded in the protrusion of the dielectric ring 1022'. The coil 1021' includes a plurality of loops 1021-1', 1021-2', and 1021-3'. Each of the plurality of loops 1021-1', 1021-2', and 1021-3' has a thickness T1' of about 50 μm. In some embodiments, the plurality of loops 1021-1', 1021-2', and 1021-3' has a circular sectional shape and the thickness T1' is the diameter of the circular sectional shape. In some embodiments, a number of the plurality of loops of the coil 1021' may be greater than or equal to three.

A number of the loop of the coil may correspond to the number of stacked dielectric layers (e.g., layers 1022A'/B'/C'). By way of example, when the number of loops is greater than three, the dielectric layer 1022B' and the loop 1021-2' may be duplicated to reach the target number of loops. Each loop of the plurality of loops 1021-1', 1021-2', and 1021-3' are correspondingly embedded in a respective one of the plurality of dielectric layers 1022A', 1022B', and 1022C' of the dielectric ring 1022'. Each loop of the plurality of loops 1021-1', 1021-2', and 1021-3' is arranged at a different distance with respect to the bottom surface of the dielectric ring 1022'. The distance of each loop of the plurality of loops 1021-1', 1021-2', and 1021-3' from the bottom surface of the dielectric ring 1022' may be determined according to the stacking sequence of the plurality of dielectric layers 1022A', 1022B', and 1022C' of the dielectric ring 1022'. In some embodiments, in the dielectric layer 1022A' farthest from the base dielectric layer 1022D', the loop 1021-1' embedded therein is disposed closer to a surface of the dielectric layer 1022A' close to the adjacent dielectric layer 1022B'. In some embodiments, in the dielectric layer 1022C' closest to the base dielectric layer 1022D', the loop 1021-3' embedded therein is disposed closer to a surface of the dielectric layer 1022C' close to the adjacent dielectric layer 1022B'. In some embodiments, the dielectric layer 1022B' has a loop 1021-2' disposed to be equidistant to the two adjacent dielectric layers 1022A' and 1022C'. In some embodiments, the coil 1021' is made of Molybdenum-Manganese.

FIG. 4 illustrates a schematic isometric view of the coil 1021' according to some other embodiments of the instant disclosure. Referring to both FIG. 2 and FIG. 4, in some embodiments, the plurality of loops 1021-1', 1021-2', and 1021-3' of the coil 1021' are ring shaped metals coupled to each other to form a cylindrical helix structure. In some embodiments, the coil 1021' forms a left-handed helix. The plurality of loops 1021-1', 1021-2', and 1021-3' form a helix shape wherein, when applying a counterclockwise screwing motion to the coil 1021' (e.g., starting from the loop 1021-1' farthest from the base dielectric layer 1022D'), the helix extends toward the base dielectric layer 1022D'. In the instant embodiment, the plurality of loops 1021-1', 1021-2', and 1021-3' have the same radius to each other and are concentric with each other. Adjacent loops 1021-1', 1021-2', and 1021-3' are coupled to each other through metal contacts Y' between corresponding adjacent dielectric layers 1022A', 1022B', and 1022C'. Each of the plurality of loops 1021-1', 1021-2', and 1021-3' having a gap X' that terminates a conductive path within each loop. The gaps X' of the plurality of loops 1021-1', 1021-2', and 1021-3' are positioned in a clockwise rotational sequence from each other (starting from the gap X' of the loop 1021-1' farthest from the base dielectric layer 1022D'). Metal contacts Y' of a subsequent layer may positionally offset each other by a gap distance X'. The metal contacts Y' are formed to be orthogonal with the plurality of loops 1021-1', 1021-2', and 1021-3'. A pitch distance between the plurality of loops 1021-1', 1021-2', and 1021-3' of the coil 1021' may range between about 100 μm and about 300 μm.

Figure 3:
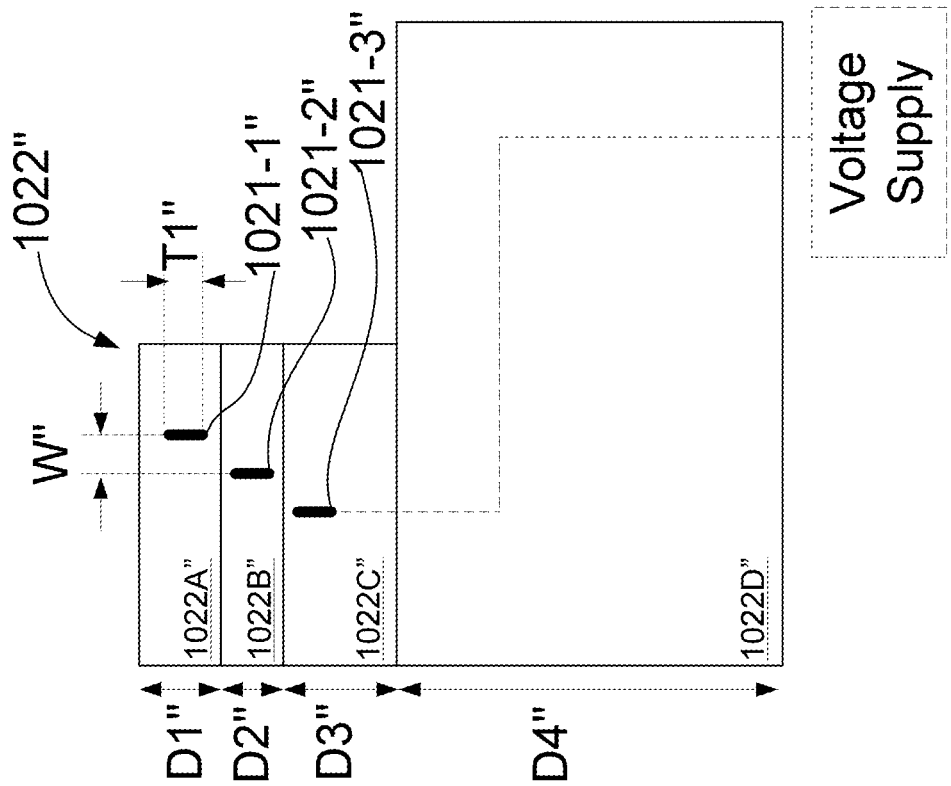
FIG. 3 illustrates a cross section of a dielectric ring according to some other embodiments of the instant disclosure.

FIG. 3 illustrates a cross section of a dielectric ring 1022" according to some other embodiments of the instant disclosure. The dielectric ring 1022" of the edge ring assembly may be formed by a plurality of dielectric layers, e.g., layers 1022A", 1022B", and 1022C", and a base dielectric layer 1022D" stacked on top of one another. The base dielectric layer 1022D" forms a top facing surface (top surface) of the dielectric ring 1022" and a bottom surface of the dielectric ring 1022" opposite the top facing surface. The plurality of dielectric layers 1022A", 1022B", and 1022C" forms a protrusion of the dielectric ring 1022" upward extending from the top surface of the dielectric ring 1022". In some embodiments, the plurality of dielectric layers 1022A", 1022B", and 1022C" and a base dielectric layer 1022D" comprises toroid structures. The plurality of dielectric layers 1022A", 1022B", and 1022C" may have the same planar area and be aligned to each other when stacked on top of one another. The base dielectric layer 1022D" has a planar area greater than each one of the plurality of dielectric layers 1022A", 1022B", and 1022C". In some embodiments, the outer radius of the plurality of dielectric layers 1022A", 1022B", 1022C", and the base dielectric layer 1022D' are substantially the same, while the inner radius of the plurality of dielectric layers 1022A", 1022B", and 1022C" is greater than the inner radius of the base dielectric layer 1022D". The area left exposed on a surface of the base dielectric layer 1022D" after stacking the plurality of dielectric layers 1022A", 1022B", and 1022C" thereon forms the step base of the dielectric ring 1022".

In some embodiments, a height of the protrusion is configured to be greater than a thickness of a wafer. In the illustrated embodiment, the height of the protrusion of the dielectric ring 1022" is defined as a sum of the thickness of each of the plurality of dielectric layers 1022A", 1022B", and 1022C". The thickness of the plurality of dielectric layers 1022A', 1022B", and 1022C" may be the same or different from each other. In an exemplary embodiment, when the thickness of the plurality of dielectric layers 1022A", 1022B", and 1022C" are different from each other, the thickness D1" of the dielectric layer 1022A" is about 160 μm, the thickness D2" of the dielectric layer 1022B" is about 100 μm, and the thickness D3' of the dielectric layer 1022C" is about 640 μm. In an exemplary embodiment, the thickness D4" of the base dielectric layer 1022D" is about 10 mm. In some embodiments, the dielectric ring may be made of ceramic material.

In some embodiments, the coil 1021" is embedded in the protrusion of the dielectric ring 1022". The coil 1021" includes a plurality of loops 1021-1", 1021-2" and 1021-3". Each of the plurality of loops 1021-1", 1021-2" and 1021-3" has a thickness T1" of about 50 μm. In some embodiments, the plurality of loops 1021-1", 1021-2" and 1021-3" has a circular sectional shape and the thickness T1" is the diameter of the circular sectional shape. A number of the plurality of loops 1021-1", 1021-2", and 1021-3" of the coil 1021" may be greater than or equal to three.

A number of the loop of the coil may correspond to the number of stacked dielectric layers (e.g., layers 1022A"/B"/C"). By way of example, when the number of loops is greater than three, the dielectric layer 1022B" and the loop 1021-2" may be duplicated to reach the target number of loops. Each loop of the plurality of loops 1021-1", 1021-2" and 1021-3" are correspondingly embedded in a respective one of the plurality of dielectric layers 1022A", 1022B", and 1022C" of the dielectric ring 1022". Each loop of the plurality of loops 1021-1", 1021-2", and 1021-3" has a different distance with respect to the bottom surface of the dielectric ring 1022". The distance of each loop of the plurality of loops 1021-1", 1021-2", and 1021-3" from the bottom surface of the dielectric ring 1022" may be determined according to the stacking sequence of the plurality of dielectric layers 1022A", 1022B", and 1022C" of the dielectric ring 1022". In some embodiments, in the dielectric layer 1022A" farthest from the base dielectric layer 1022D", the loop 1021-1" embedded therein is disposed closer to a surface of the dielectric layer 1022A" close to the adjacent dielectric layer 1022B". In some embodiments, in the dielectric layer 1022C" closest to the base dielectric layer 1022D", the loop 1021-3" embedded therein is disposed closer to a surface of the dielectric layer 1022C" close to the adjacent dielectric layer 1022B". In some embodiments, the dielectric layer 1022B" has a loop 1021-2" disposed to be equidistant to the two adjacent dielectric layers 1022A" and 1022C". In some embodiments, the coil 1021" may be made of Molybdenum-Manganese.

FIG. 5A illustrates a top view of a coil 1021" according to some embodiments of the instant disclosure. FIG. 5B illustrates a schematic isometric view of a coil 1021" according to some embodiments of the instant disclosure. Referring to both FIG. 3, FIG. 5A, and FIG. 5B, in some embodiments, the plurality of loops 1021-1", 1021-2", and 1021-3" of the coil 1021" are ring shaped metals coupled to each other to form a conical helix structure. In some embodiments, the coil 1021" forms a left-handed helix. The plurality of loops 1021-1", 1021-2" and 1021-3" form a helix shape wherein, when applying a counterclockwise screwing motion to the coil 1021" (e.g., starting from the loop 1021-1" farthest from the base dielectric layer 1022D"), the helix extends toward the base dielectric layer 1022D". In the instant embodiment, the plurality of loops 1021-1", 1021-2", and 1021-3" have different radius to each other and are concentric with each other. The loop 1021-3" having the largest radius being disposed in the dielectric layer 1022C" closest to the base dielectric layer 1022D". The loop 1021-1" having the smallest radius being disposed in the dielectric layer 1022A" farthest from the base dielectric layer 1022D". A radial distance W" between adjacent loops is about 100 μm. Adjacent loops 1021-1", 1021-2" and 1021-3" are coupled to each other by forming metal contacts Y" through corresponding adjacent dielectric layers 1022A", 1022B", and 1022C". Each of the plurality of loops 1021-1", 1021-2" and 1021-3" having a gap X" to that terminates a conductive path within each loop. The gaps X" of the plurality of loops 1021-1", 1021-2" and 1021-3" are positioned in a clockwise rotational sequence from each other (starting from the gap X" of the loop 1021-1" farthest from the base dielectric layer 1022D"). Metal contacts Y" of a subsequent layer may positionally offset each other by a gap distance X". Because the plurality of loops 1021-1", 1021-2", and 1021-3" have different radius from each other and the metal contacts Y" are formed orthogonally with the plurality of loops 1021-1", 1021-2", and 1021-3", a planar contact Y1" tangentially extending towards the center of the loop 1021-2", and 1021-3" is formed. The length of the planar contact Y1" may be substantially the same as the radial distance W" between adjacent loops. A pitch distance between the plurality of loops 1021-1", 1021-2", and 1021-3" of the coil 1021" may range between about 100 μm and about 300 μm.

Figure 6:
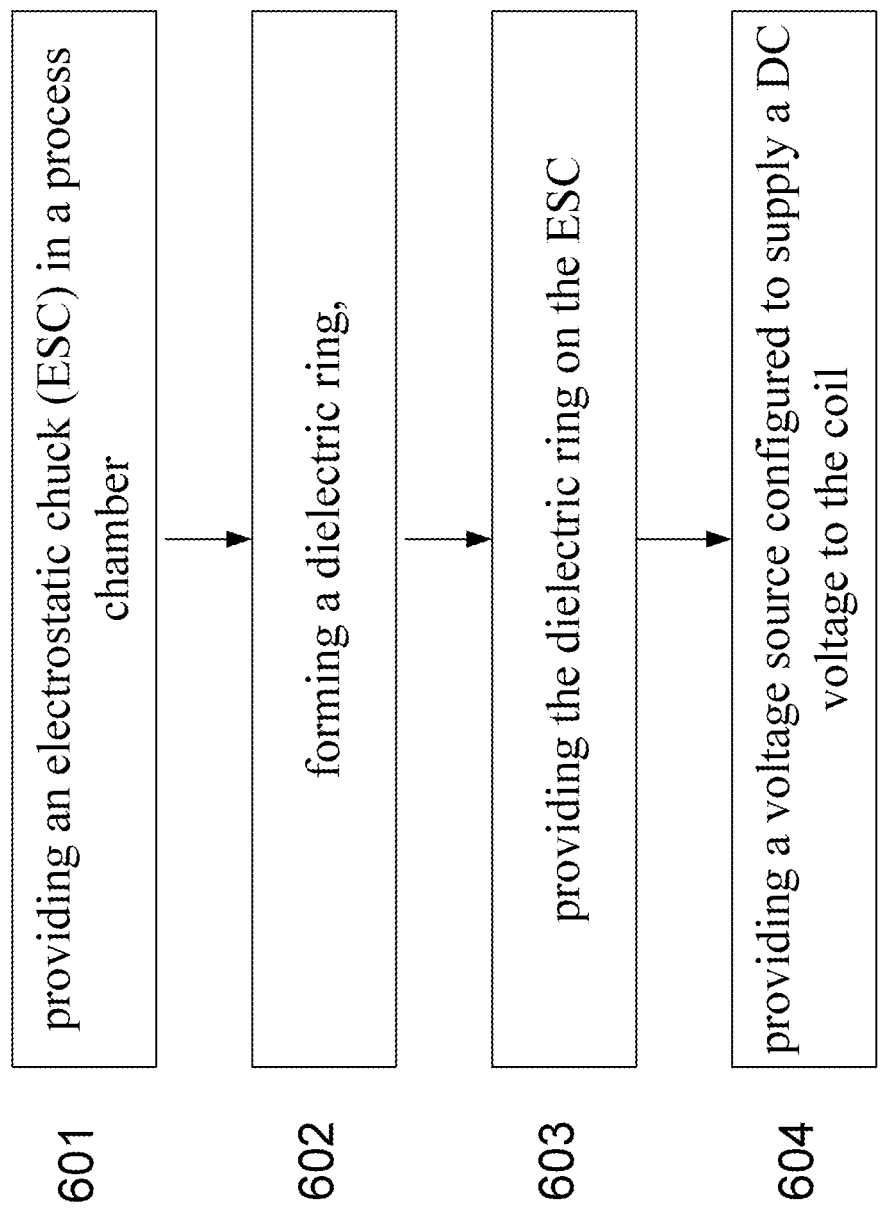
FIG. 6 illustrates a flowchart of a method of forming a plasma processing system according to some embodiments of the instant disclosure.

FIG. 6 illustrates a flowchart of a method of forming a plasma processing system according to some embodiments of the instant disclosure. The method includes providing an electrostatic chuck (ESC) in a process chamber (601), providing the dielectric ring on the ESC (602), and providing a voltage source configured to supply a DC voltage to the coil (603) to generate a magnetic field for adjusting a tilting angle of ions in a plasma to be perpendicular to a top surface of the ESC. In some embodiments, the method of forming the plasma processing system further includes providing a tuning ring to cap the dielectric ring. In some embodiments the method of forming the plasma processing system further includes providing at least one quartz ring surrounding the ESC and providing a quartz filler between the at least one quartz ring and the ESC. The method of providing at least one quartz ring comprises providing a first quartz ring surrounding the ESC and providing a second quartz ring over the first quartz ring. The second quartz ring may be detachable from the first quartz ring.

Figure 7:
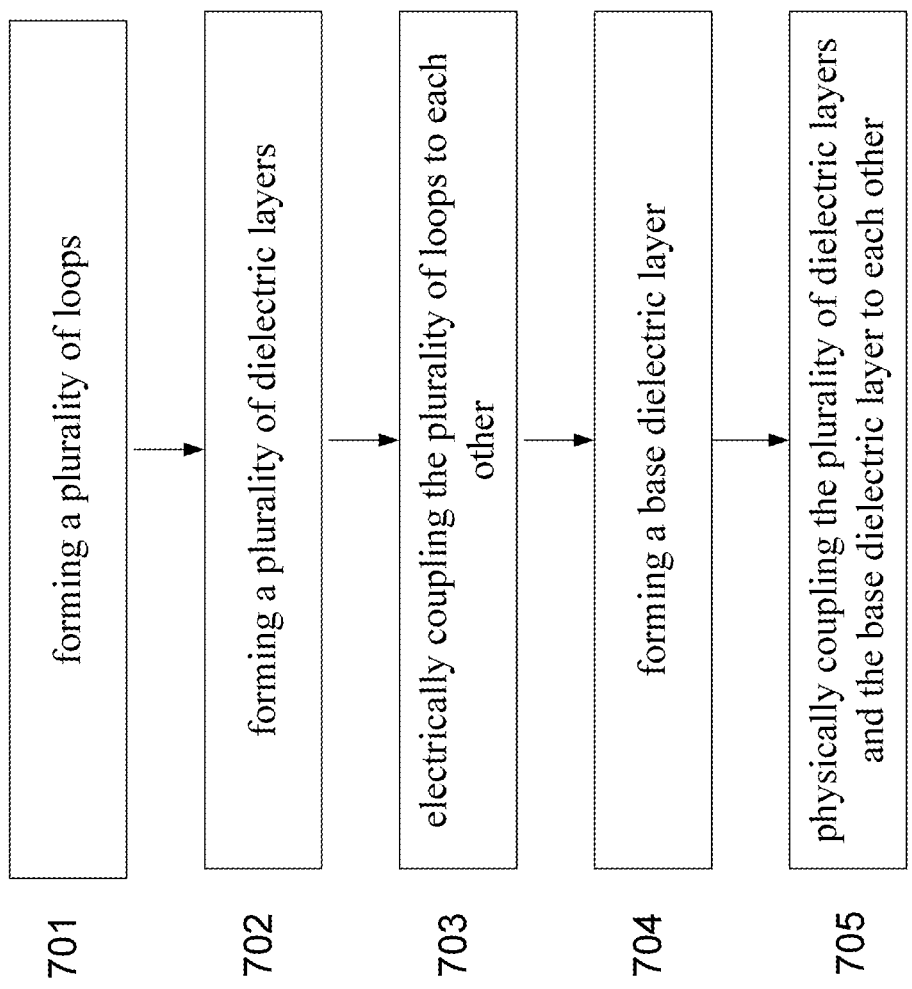
FIG. 7 illustrates a flowchart of a method of forming an edge ring according to some embodiments of the instant disclosure.

FIG. 7 illustrates a flowchart of a method of forming an edge ring according to some embodiments of the instant disclosure. The method comprises forming a plurality of loops (701), forming a plurality of dielectric layers (702), electrically coupling the plurality of loops to each other (703), forming a base dielectric layer (704), and physically coupling the plurality of dielectric layers and the base dielectric layer to each other (705). The plurality of loops forms a coil when electrically coupled to each other. In some embodiments, the plurality of loops are correspondingly embedded in the plurality of dielectric layers. When the plurality of dielectric layers are formed, the plurality of loops are correspondingly embedded in the plurality of dielectric layers.

The plurality of dielectric layers and the base dielectric layer may be formed by sintering ceramic powder. A mold may be used to form the shape of the dielectric layer. The ceramic powder is placed within the mold and the preformed loop is buried in the ceramic powder. Heat or pressure may be applied to the ceramic powder through the mold. The ceramic powder is fused to form a solid structure that is the dielectric layer. The base dielectric layer has a surface area greater than each of the plurality of dielectric layers. The base dielectric layer may be formed in the same way as the plurality of dielectric layers using a different mold. And, there may be no loop embedded in the base dielectric layer. In some embodiments, the plurality of dielectric layers and the base dielectric layer are fused to each other using an adhesive material. In some other embodiments, the plurality of dielectric layers and the base dielectric layer are fused to each other by sequentially forming plurality of dielectric layers and the base dielectric layer on top of each other and the fusing will occur during the sintering process.

In some embodiments, the metal contacts used to interconnect adjacent loops may be pre-formed with one of the adjacent loops. And, a part of the metal contact is protruding from the dielectric layer. In some other embodiments, the metal contacts used to interconnect adjacent loops may be pre-formed and divided in the adjacent loops. Half of the metal contact is formed on one of the adjacent loops and another half of the metal contact is formed on another one of the adjacent loops. The two halves of the metal contact are electrically coupled to each other when the corresponding adjacent dielectric layers are fused to each other. In some further embodiments, the metal contact is formed after forming the dielectric layers. Holes may be formed on the dielectric layers to accommodate the metal contact. When there is a gap in the hole after the metal contact is disposed, the gap may be filled during adhesion process of the dielectric layers to each other.

According to some embodiments, a plasma processing system includes an ESC surrounded by an edge ring assembly. The edge ring assembly includes a dielectric ring having a coil embedded therein. The coil may form a conical helix shape or a cylindrical helix shape. A supply voltage is supplied to the coil to generate a magnetic field. The magnetic field is configured to generate a force applied to ions in the plasma. When the force is applied to ions in the proximity of the plasma sheath, the ions having a tilted direction angle towards a wafer may be pushed to correct the tilted direction angle. The tilted direction angle may range from about 75° to 85°. After correction applying the force from the magnetic field, the corrected direction angle may range from about 88° to 90°. As a result, when performing plasma etching process, the trenches with tilted profile formed on the edge region of the wafer during plasma etching may be reduced or avoided. Thus, the fabrication yield of the semiconductor process may be increased.

Accordingly, one aspect of the instant disclosure provides a plasma processing system for processing a wafer, which comprises an electrostatic chuck (ESC); and an edge ring assembly surrounding the ESC. The edge ring assembly comprising a dielectric ring having a top surface, a bottom surface opposite the top surface, and a protrusion upward-extending from the top surface; and a coil embedded in the protrusion of the dielectric ring, the coil having a plurality of loops, each loop of the plurality of loops having a different distance with respect to the bottom surface of the dielectric ring.

In some embodiments, the system further comprising a tuning ring coupleable over the top surface of the dielectric ring and covers the protrusion of the dielectric ring.

In some embodiments, a height of the protrusion of the dielectric ring is greater than or substantially equal to a thickness of a wafer.

In some embodiments, the plurality of loops of the coil are ring shaped metals coupled to each other to form a cylindrical helix shape.

In some embodiments, the plurality of loops of the coil are ring shaped metals coupled to each other to form a conical helix shape.

In some embodiments, the plurality of loops are correspondingly embedded within a plurality of dielectric layers, the plurality of dielectric layers are stacked on top of each other to form the dielectric ring.

In some embodiments, a pitch between the plurality of loops of the coil ranges between about 100 μm and about 300 μm.

In some embodiments, a number of the plurality of loops of the coil is greater than or equal to three.

In some embodiments, a material of the tuning ring includes silicon.

In some embodiments, the coil is coupled to a DC voltage source.

In some embodiments, a supplied voltage of the DC voltage source ranges from about −24 volts to +24 volts.

In some embodiments, the system further comprising a voltage terminal disposed through the ESC and electrically coupled to the DC voltage source.

Accordingly, another aspect of the instant disclosure provides a method of forming a dielectric ring, which comprises forming a plurality of loops, the plurality of loops being configured to form a coil; forming a plurality of dielectric layers, the plurality of loops being correspondingly embedded in the plurality of dielectric layers; electrically coupling the plurality of loops to each other; forming a base dielectric layer, the base dielectric layer having a surface area greater than each surface area of the plurality of dielectric layers; and physically coupling the plurality of dielectric layers and the base dielectric layer to each other.

In some embodiments, the plurality of loops are ring shaped metals coupled to each other to form a cylindrical helix shape or a conical helix shape.

In some embodiments, the method further comprising sintering ceramic powder to form the plurality of dielectric layers and the base dielectric layer.

In some embodiments, the method further comprises providing a metal contact between adjacent loops to electrically couple the plurality of loops.

Accordingly, yet another aspect of the instant disclosure provides a plasma processing chamber, which comprises an electrostatic chuck (ESC) having a step edge on a periphery, the step edge of the ESC having a step wall perpendicular to a step base; and an edge ring assembly surrounding the ESC. The edge ring assembly comprising a first quartz ring surrounding the periphery of the ESC, the first quartz ring having a step edge on an inner periphery, the step edge of the first quartz ring having a step wall perpendicular to a step base; a second quartz ring disposed over the first quartz ring, the second quartz ring having a step edge on an inner periphery, the step edge of the second quartz ring having a step wall perpendicular to a step base; a dielectric ring disposed over the step base of the ESC and the step base of the first quartz ring, the dielectric ring having a step edge on an inner periphery, the step edge of the dielectric ring having a step wall perpendicular to a step base; a coil embedded in the dielectric ring and formed along the step wall of the dielectric ring, the coil having a plurality of loops, each loop of the plurality of loops having a different distance corresponding to the step base of the dielectric ring; and a tuning ring disposed over the step base of the dielectric ring and the step base of the second quartz ring, the tuning ring having a top surface, a bottom surface opposite the top surface, and a cavity formed along the bottom surface, the cavity capping a portion of the dielectric ring protruding from the step base of the dielectric ring.

In some embodiments, the plurality of loops of the dielectric ring are ring shaped metals coupled to each other to form a cylindrical helix shape or a conical helix shape.

In some embodiments, the plurality of loops are correspondingly embedded within a plurality of dielectric layers, the plurality of dielectric layers are stacked on top of each other to form the dielectric ring.

In some embodiments, a material of the dielectric ring includes ceramic, and a material of the coil includes Molybdenum-Manganese.

In some embodiments, the system further comprises a quartz filler disposed between the edge ring assembly and the ESC.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A plasma processing system for processing a wafer, comprising:
an electrostatic chuck (ESC); and an edge ring assembly surrounding the ESC, the edge ring assembly comprising:
- a dielectric ring having a top surface, a bottom surface opposite the top surface, and a protrusion upward-extending from the top surface; and
- a coil embedded in the protrusion of the dielectric ring, the coil having a plurality of loops, each of the plurality of loops having a different distance with respect to the bottom surface of the dielectric ring;
- wherein the plurality of loops are correspondingly embedded within a plurality of dielectric layers, the plurality of dielectric layers are stacked on top of each other to form the dielectric ring.

2. The system of claim 1, further comprising:
- a tuning ring coupleable over the top surface of the dielectric ring and covers the protrusion of the dielectric ring.

3. The system of claim 1, wherein a height of the protrusion of the dielectric ring is greater than or substantially equal to a thickness of a wafer.

4. The system of claim 1, wherein the plurality of loops of the coil are ring shaped metals coupled to each other to form a cylindrical helix shape.

5. The system of claim 1, wherein the plurality of loops of the coil are ring shaped metals coupled to each other to form a conical helix shape.

6. The system of claim 1, wherein a pitch between the plurality of loops of the coil ranges between about 100 μm and about 300 μm.

7. The system of claim 1, wherein a number of the plurality of loops of the coil is greater than or equal to three.

8. The system of claim 2, wherein a material of the tuning ring includes silicon.

9. The system of claim 1, wherein the coil is coupled to a DC voltage source, wherein a supplied voltage of the DC voltage source ranges from 24 volts to +24 volts.

10. The system of claim 8, further comprising:
- a voltage terminal disposed through the ESC and electrically coupled to a DC voltage source.

11. A plasma processing chamber, comprising:
- an electrostatic chuck (ESC) having a step edge on a periphery, the step edge of the ESC having a step wall perpendicular to a step base; and
- an edge ring assembly surrounding the ESC, the edge ring assembly comprising:
- a first quartz ring surrounding the periphery of the ESC, the first quartz ring having a step edge on an inner periphery, the step edge of the first quartz ring having a step wall perpendicular to a step base;
- a second quartz ring disposed over the first quartz ring, the second quartz ring having a step edge on an inner periphery, the step edge of the second quartz ring having a step wall perpendicular to a step base;
- a dielectric ring disposed over the step base of the ESC and the step base of the first quartz ring, the dielectric ring having a step edge on an inner periphery, the step edge of the dielectric ring having a step wall perpendicular to a step base;
- a coil embedded in the dielectric ring and formed along the step wall of the dielectric ring, the coil having a plurality of loops, each loop of the plurality of loops having a different distance corresponding to the step base of the dielectric ring; and
- a tuning ring disposed over the step base of the dielectric ring and the step base of the second quartz ring, the tuning ring having a top surface, a bottom surface opposite the top surface, and a cavity formed along the bottom surface, the cavity capping a portion of the dielectric ring protruding from the step base of the dielectric ring.

12. The system of claim 11, wherein the plurality of loops of the coil are ring shaped metals coupled to each other to form a cylindrical helix shape or a conical helix shape.

13. The system of claim 11, wherein the plurality of loops are correspondingly embedded within a plurality of dielectric layers, the plurality of dielectric layers are stacked on top of each other to form the dielectric ring.

14. The system of claim 11, wherein a material of the dielectric ring includes ceramic, and a material of the coil includes Molybdenum-Manganese.

15. The system of claim 11, further comprising:
- a quartz filler disposed between the edge ring assembly and the ESC.

* * * * *